(12) United States Patent
Lee et al.

(10) Patent No.: US 10,734,335 B2
(45) Date of Patent: Aug. 4, 2020

(54) ELECTRONIC COMPONENT PACKAGE

(71) Applicant: SAMSUNG ELECTRONICS CO., LTD., Suwon-si (KR)

(72) Inventors: Yun Tae Lee, Suwon-si (KR); Moon Il Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/111,713

(22) Filed: Aug. 24, 2018

(65) Prior Publication Data

US 2018/0366426 A1    Dec. 20, 2018

Related U.S. Application Data

(63) Continuation of application No. 15/707,266, filed on Sep. 18, 2017, now Pat. No. 10,304,791, which is a (Continued)

(30) Foreign Application Priority Data

Mar. 31, 2016   (KR) ........................ 10-2016-0039274

(51) Int. Cl.
*H01L 23/00*      (2006.01)
*H01L 23/48*      (2006.01)
(Continued)

(52) U.S. Cl.
CPC .............. *H01L 24/02* (2013.01); *H01L 23/16* (2013.01); *H01L 23/29* (2013.01); *H01L 23/3128* (2013.01); *H01L 23/367* (2013.01); *H01L 23/481* (2013.01); *H01L 23/49811* (2013.01); *H01L 23/5389* (2013.01); *H01L 24/17* (2013.01); *H01L 24/20* (2013.01); (Continued)

(58) Field of Classification Search
CPC ....................................................... H01L 23/053
See application file for complete search history.

(56) References Cited

U.S. PATENT DOCUMENTS

2006/0186536 A1\*   8/2006   Hsu .......................... H01L 23/36
                                                                                  257/720
2007/0145571 A1    6/2007   Lee et al.
(Continued)

FOREIGN PATENT DOCUMENTS

JP      2002-217328 A    8/2002
JP      2008-141144 A    6/2008
(Continued)

OTHER PUBLICATIONS

Taiwanese Office Action dated Nov. 28, 2018 issued in Taiwanese Patent Application No. 107130577 (with English translation).
(Continued)

*Primary Examiner* — William A Harriston
(74) *Attorney, Agent, or Firm* — Sughrue Mion, PLLC

(57) ABSTRACT

An electronic component package includes: a frame, including a through-hole and a through-wiring; an electronic component disposed in the through-hole of the frame; a metal plate disposed on a first side of the electronic component and the frame; and a redistribution layer disposed on a second side of the electronic component opposing the first side and electrically connected to the electronic component.

6 Claims, 4 Drawing Sheets

Related U.S. Application Data continuation of application No. 15/448,039, filed on Mar. 2, 2017, now Pat. No. 10,020,272.

(51) Int. Cl.
  *H01L 23/31* (2006.01)
  *H01L 23/29* (2006.01)
  *H01L 23/16* (2006.01)
  *H01L 23/367* (2006.01)
  *H01L 23/498* (2006.01)
  *H01L 23/538* (2006.01)

(52) U.S. Cl.
  CPC .............. *H01L 24/32* (2013.01); *H01L 24/33* (2013.01); *H01L 2224/0237* (2013.01); *H01L 2224/04105* (2013.01); *H01L 2224/12105* (2013.01); *H01L 2224/171* (2013.01); *H01L 2224/2919* (2013.01); *H01L 2224/3213* (2013.01); *H01L 2224/32245* (2013.01); *H01L 2224/73267* (2013.01); *H01L 2225/1035* (2013.01); *H01L 2225/1041* (2013.01); *H01L 2225/1094* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/3025* (2013.01)

(56) References Cited

U.S. PATENT DOCUMENTS

| | | |
|---|---|---|
| 2008/0029872 A1 | 2/2008 | Hsu et al. |
| 2008/0116569 A1 | 5/2008 | Huang et al. |
| 2008/0205008 A1 | 8/2008 | Sun et al. |
| 2009/0294942 A1 | 12/2009 | Palmer et al. |
| 2014/0070396 A1 | 3/2014 | Kyozuka et al. |
| 2014/0239464 A1 | 8/2014 | Chung et al. |
| 2014/0367808 A1 | 12/2014 | Kuratani et al. |
| 2015/0021754 A1* | 1/2015 | Lin ................ H01L 23/5389 257/712 |
| 2015/0028477 A1 | 1/2015 | Jung et al. |
| 2015/0279759 A1 | 10/2015 | Miyakoshi et al. |

FOREIGN PATENT DOCUMENTS

| | | |
|---|---|---|
| JP | 2014-56925 A | 3/2014 |
| TW | 200731482 A | 8/2007 |
| TW | 200841445 A | 10/2008 |
| TW | 201434120 A | 9/2014 |
| TW | 201537719 A | 10/2015 |
| WO | 2013/039239 A1 | 3/2013 |

OTHER PUBLICATIONS

U.S. Office Action dated Jun. 29, 2017 issued in U.S. Appl. No. 15/448,039.

U.S. Notice of Allowance dated Jan. 22, 2018 issued in U.S. Appl. No. 15/448,039.

Taiwanese Patent Application dated Mar. 13, 2018 issued in Taiwanese Patent Application No. 106106582 (with English translation).

U.S. Non-Final Office Action dated Mar. 9, 2018 issued in U.S. Appl. No. 15/707,266.

Communication dated Jun. 3, 2019, issued by the Taiwan Patent Office in counterpart Taiwan Application No. 107130577.

Korean Office Action dated Jan. 4, 2019 issued in Korean Patent Application No. 10-2016-0039274 (with English translation).

\* cited by examiner

ELECTRONIC COMPONENT PACKAGE

CROSS-REFERENCE TO RELATED APPLICATION(S)

This application is a continuation of U.S. patent application Ser. No. 15/707,266, filed on Sep. 18, 2017, which is a continuation of U.S. patent application Ser. No. 15/448,039, filed on Mar. 2, 2017, now patented as U.S. Pat. No. 10,020,272, issued on Jul. 10, 2018, which claims the benefit of priority to Korean Patent Application No. 10-2016-0039274, filed on Mar. 31, 2016 in the Korean Intellectual Property Office, their entire disclosure of which are incorporated herein by reference.

BACKGROUND

1. Technical Field

The present disclosure relates to an electronic component package.

2. Description of Related Art

An electronic component package is defined as a package technology for electrically connecting an electronic component to a printed circuit board (PCB), such as a main board of an electronic device or the like, and protecting the electronic component from external impacts. One recent main trend in the development of technology related to electronic components is to reduce the size of the electronic components. As such, in the package field, and in accordance with a rapid increase in demand for miniaturized electronic components or the like, there has been increased demand for the implementation of an electronic component package having a compact size and including a plurality of pins.

One package technology suggested in order to satisfy the technical demand described above is a wafer level package (WLP) using the redistribution of an electrode pad of an electronic component formed on a wafer. Examples of the wafer level package include a fan-in wafer level package and a fan-out wafer level package. In particular, the fan-out wafer level package has a compact size and is advantageous in implementing a plurality of pins. Therefore, recently, the fan-out wafer level package has been actively developed.

SUMMARY

An aspect of the present disclosure may provide an electronic component package in which heat generated in an electronic component may be effectively radiated.

One of several solutions suggested through the present disclosure may be to use a metal plate. According to an aspect of the present disclosure, an electronic component package may include: a frame including a through-hole and a through-wiring; an electronic component disposed in the through-hole of the frame; a metal plate disposed on a first side of the electronic component and the frame; and a redistribution layer disposed on a second side of the electronic component opposing the first side and electrically connected to the electronic component.

The electronic component package may further include a first adhesive layer interposed between the metal plate and the electronic component.

The first adhesive layer may be formed of conductive epoxy.

The metal plate and the electronic component may directly contact each other.

The electronic component package may further include a second adhesive layer interposed between the metal plate and the frame.

The second adhesive layer may be formed of solder.

The electronic component package may further include a first adhesive layer interposed between the metal plate and the electronic component and a second adhesive layer interposed between the metal plate and the frame. The first and second adhesive layers may be formed of different materials.

The frame may include a wiring layer formed on an upper surface thereof, and the metal plate and the wiring layer may directly contact each other.

The number of through-wirings may be plural, and the metal plate may be electrically connected to some of the plurality of through-wirings and be electrically disconnected from the others, of the plurality of through-wirings.

The metal plate may be electrically disconnected from the electronic component.

The electronic component package may further include an insulating layer formed on the electronic component and the metal plate.

The insulating layer may be formed on and beneath the metal plate, and the metal plate may be embedded in the insulating layer.

The insulating layer may include a conductive via connected to the through-wiring of the frame.

The conductive via of the insulating layer may penetrate through the metal plate and be electrically disconnected from the metal plate.

The electronic component package may further include an encapsulant filled in the through-hole to encapsulate the electronic component.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
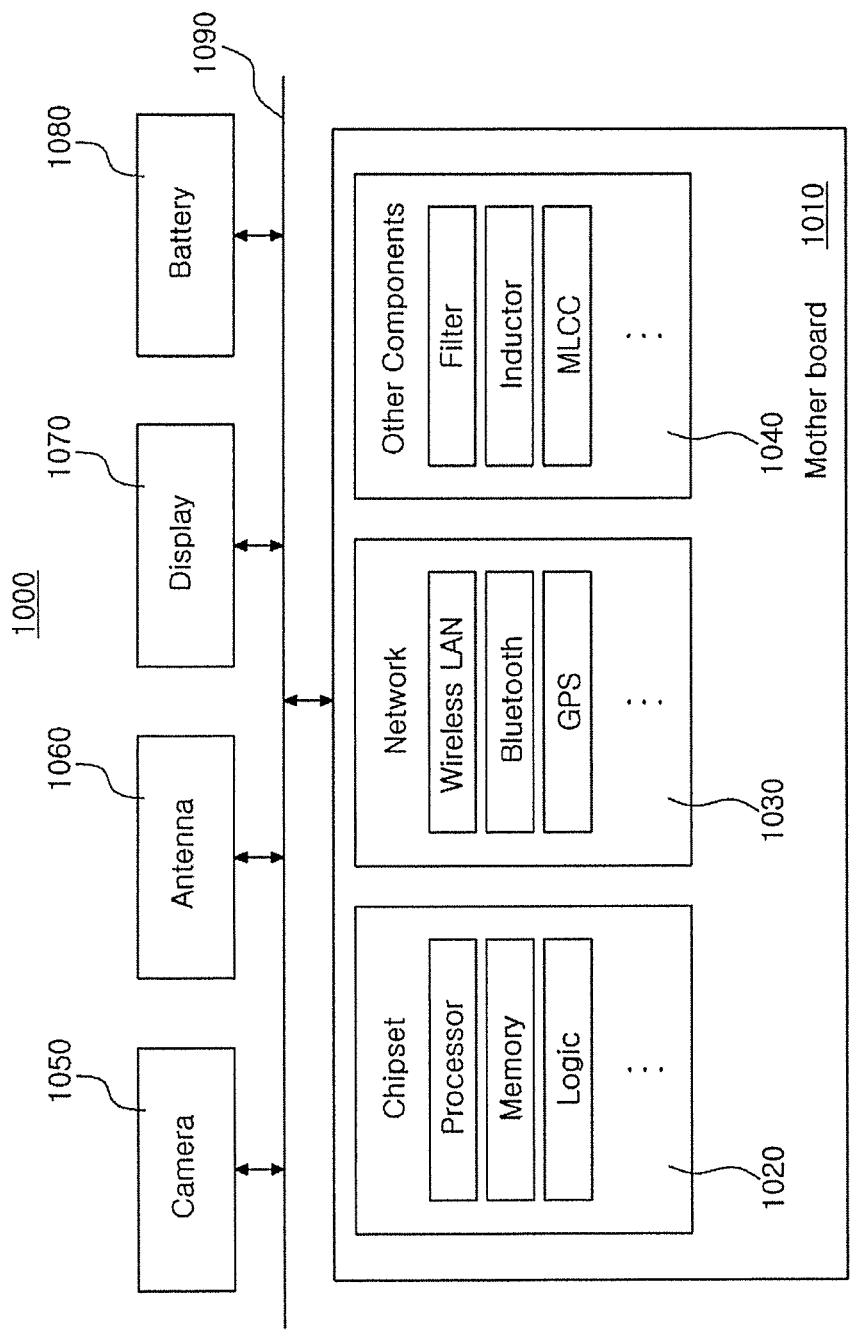
FIG. 1 is a schematic block diagram illustrating an example of an electronic device system.

FIG. 1 is a schematic block diagram illustrating an example of an electronic device system.

Referring to FIG. 1, an electronic device 1000 may accommodate a motherboard 1010 therein. The motherboard

1010 may include chip-related components 1020, network-related components 1030, other components 1040, and the like, physically or electrically connected thereto. These components may be connected to other components, to be described below, to form various signal lines 1090.

The chip-related components 1020 may include a memory chip, such as a volatile memory (for example, a dynamic random access memory (DRAM)), a non-volatile memory (for example, a read only memory (ROM)), a flash memory, etc.; an application processor chip, such as a central processor (for example, a central processing unit (CPU)), a graphics processor (for example, a graphic processing unit (GPU)), a digital signal processor, a cryptographic processor, a microprocessor, a microcontroller, etc.; a logic chip, such as an analog-to-digital converter, an application-specific integrated circuit (ASIC), etc.; and the like. However, the chip related components 1020 are not limited thereto, but may also include other types of chip related components. In addition, the chip-related components 1020 may be combined with each other.

The network-related components 1030 may include protocols, such as wireless fidelity (Wi-Fi) (Institute of Electrical and Electronics Engineers (IEEE) 802.11 family or the like), worldwide interoperability for microwave access (Wi-MAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols, and any other wireless and wired protocols designated after the above-mentioned protocols. However, the network-related components 1030 are not limited thereto, but may also include any of a plurality of other wireless or wired standards or protocols. In addition, these components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC) or the like. However, other components 1040 are not limited thereto, but may also include passive components used for various other purposes or the like. In addition, other components 1040 may be combined with each other, together with the chip-related components 1020 or the network-related components 1030 described above.

Depending on a kind of the electronic device 1000, the electronic device 1000 may include other components that may or may not be physically or electrically connected to the motherboard 1010. These other components may include, for example, a camera module 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (for example, a hard disk drive) (not illustrated), a compact disk (CD) (not illustrated), a digital versatile disk (DVD) (not illustrated), and the like. However, these other components are not limited thereto, but may also include other components used for various purposes, depending on a kind of electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch or the like. However, the electronic device 1000 is not limited thereto, and may be any other electronic device processing data.

Figure 2:
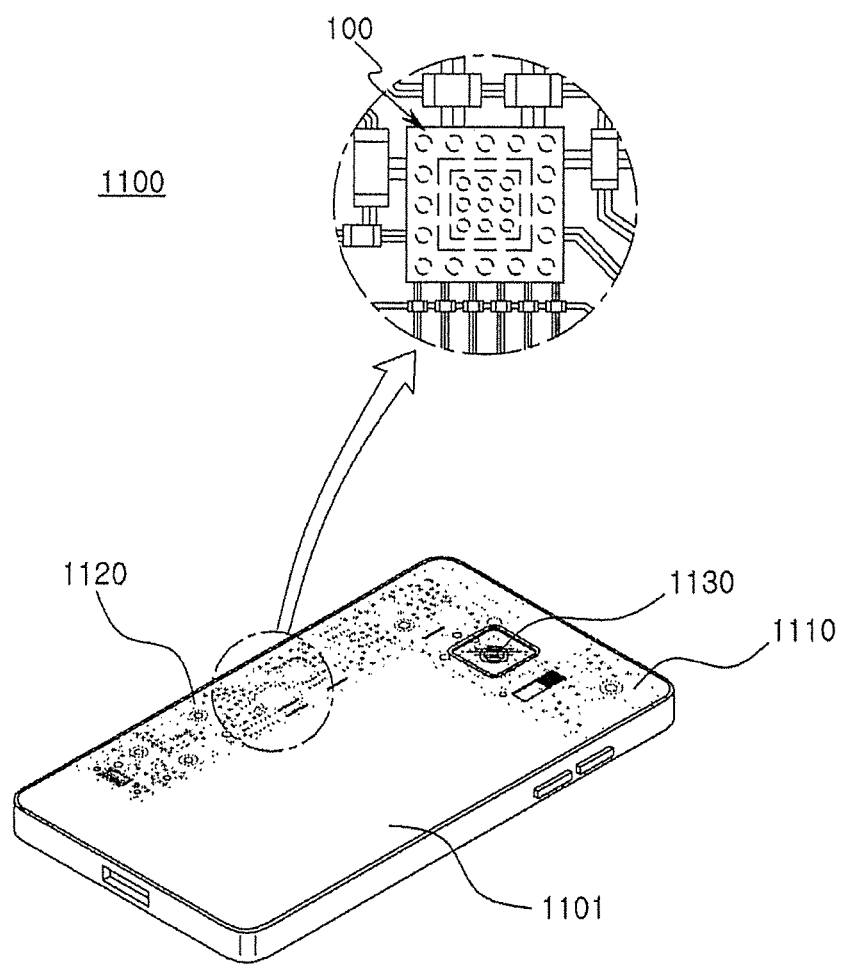
FIG. 2 is a schematic view illustrating an example of an electronic component package used in an electronic device.

FIG. 2 is a schematic view illustrating an example of an electronic component package used in an electronic device.

The electronic component package may be used for various purposes in the various electronic devices 1000 described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. In this case, some of the electronic components 1120 may be the chip-related components described above, and the electronic component package 100 may be, for example, an application processor, among the chip related components, but is not limited thereto.

Electronic Component Package

Figure 3:
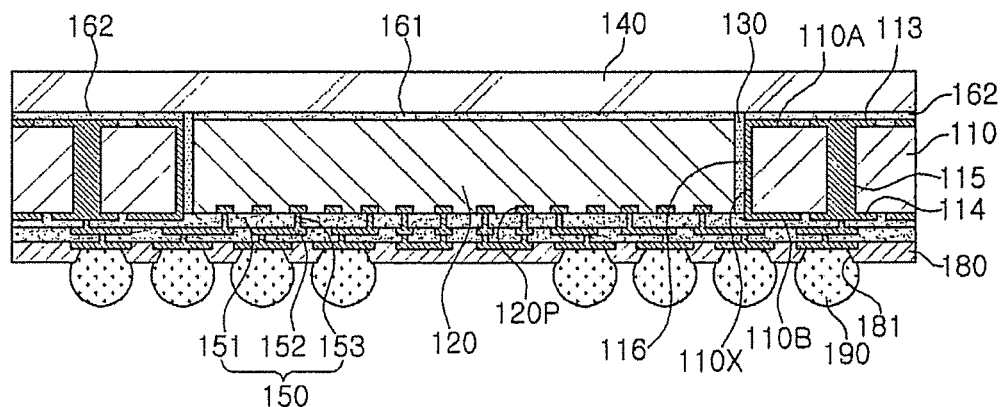
FIG. 3 is a schematic cross-sectional view illustrating an example of an electronic component package.
Figure 4:
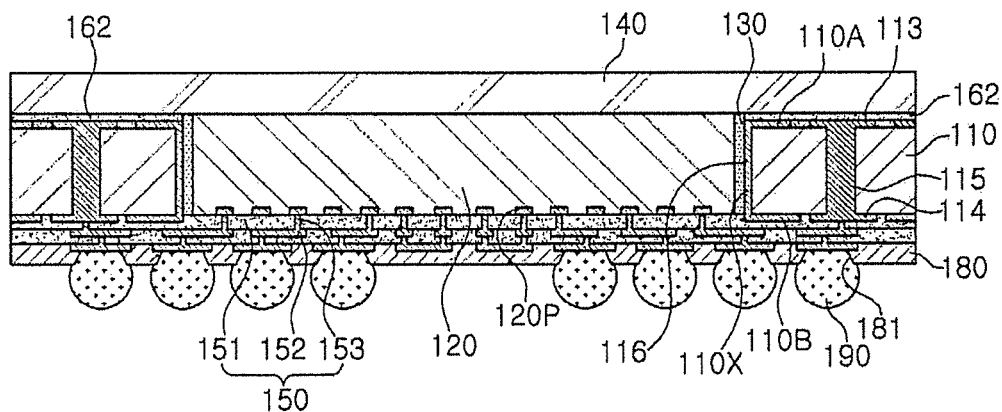
FIGS. 4 and 5 are schematic cross-sectional views illustrating modified versions of the electronic component package of FIG. 3.
Figure 5:
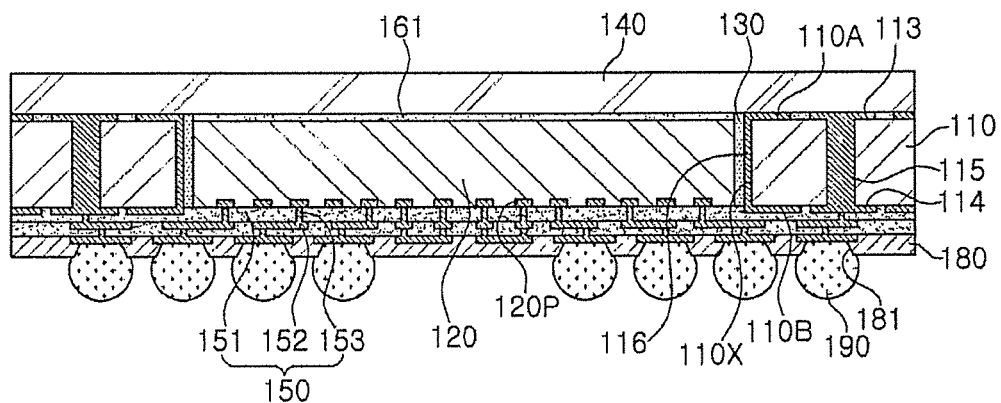

FIG. 3 is a schematic cross-sectional view illustrating an example of an electronic component package. FIGS. 4 and 5 are schematic cross-sectional views illustrating modified versions of the electronic component package of FIG. 3.

Referring to FIG. 3, an electronic component package 100, according to an example, may include a frame 110, an electronic component 120, a metal plate 140, and a redistribution layer 150, as main components thereof.

A general electronic component package has a structure in which an electronic component is molded with and surrounded by an encapsulant, such as an epoxy molding compound (EMC) or the like. In this case, most of the heat generated in the electronic component is discharged downward along a redistribution layer, and only a very small amount of heat is conducted to the encapsulant, which has low thermal conductivity, such that heat radiation characteristics are deteriorated. In the present exemplary embodiment, the metal plate 140 may be disposed on the frame 110 and the electronic component 120 to easily diffuse heat generated from the electronic component 120 or the like, and thus heat radiation characteristics may be improved.

In addition, in a case of adopting the structure in which the electronic component is simply molded with and surrounded by the encapsulant, such as the EMC or the like, operation characteristics, and the like, of an electronic device in which the electronic component is mounted may be deteriorated due to electromagnetic interference (EMI) caused by an electromagnetic wave generated from the electronic component or introduced from an external source. On the contrary, in the present exemplary embodiment, the metal plate 140 may be disposed on the electronic component 120 to block the electromagnetic wave, and thus, a problem due to the EMI may also be prevented.

Hereinafter, the above-mentioned main components and additional components of the electronic component package 100 according to an example will be described in more detail.

The frame 110, which is provided to support the electronic component package 100, may maintain rigidity of the electronic component package 100 and secure uniformity of a thickness of the electronic component package 100, and may include a through-hole (a region in which the electronic component 120 is disposed, in FIG. 3) and a plurality of through-wirings 115. The frame 110 may have an upper surface 110A and a lower surface 110B, opposing the upper surface 110A. In this case, the through-hole may penetrate between the upper surface 110A and the lower surface 110B. The electronic component 120 may be disposed in the through-hole so as to be spaced apart from the frame 110 by a predetermined distance. As a result, side surfaces of the electronic component 120 may be surrounded by the frame 110.

A material of the frame 110 is not particularly limited as long as the frame may support the electronic component package. For example, an insulating material may be used as a material of the frame 110. In this case, the insulating material may be a thermosetting resin, such as an epoxy resin, a thermoplastic resin, such as a polyimide resin, a resin having a reinforcement material, such as a glass fiber, or an inorganic filler impregnated in the thermosetting resin and the thermoplastic resin, such as pre-preg, Ajinomoto Build up Film (ABF), FR-4, Bismaleimide Triazine (BT), copper clad laminate (CCL) or the like. Alternatively, a metal having excellent rigidity and thermal conductivity may be used as a material of the frame 110. In this case, the metal may be an Fe—Ni based alloy. In this case, a copper plating may also be formed on a surface of the Fe—Ni based alloy in order to secure adhesion between the Fe—Ni based alloy and a molding material, an interlayer insulating material, or the like. In addition to the materials described above, glass, ceramic, plastic or the like, may also be used as a material of the frame.

A thickness of the frame 110 in a cross section thereof is not particularly limited, but may be designed depending on a thickness of the electronic component 120 in a cross section thereof. For example, a thickness of the frame 110 in the cross section thereof may be about 100 μm to 500 μm, depending on a kind of electronic component 120. The frame 110 may include one layer or may include a plurality of layers. In the case in which the frame 110 includes the plurality of layers, wiring layers may be disposed between the plurality of layers. In this case, the thicknesses of respective layers are not particularly limited, and an entire thickness of the respective layers may be adjusted, as described above.

As in a form illustrated in FIG. 3, the frame 110 may include a first wiring layer 113 formed on the upper surface 110A thereof, a second wiring layer 116 formed on an inner wall 110X thereof, a third wiring layer 114 formed on the lower surface 1108 thereof, and through-wirings 115 penetrating therethrough. In this case, the number of through-wirings 115 may be plural.

The first wiring layer 113 may serve as a redistribution pattern, and a conductive material, such as copper (Cu), aluminum (Al), silver (Ag), tin (Sn), gold (Au), nickel (Ni), lead (Pd), titanium (Ti), or alloys thereof, may be used as a material of the first wiring layer 113. The first wiring layer 113 may perform various functions, depending on a design of the corresponding layer. For example, the first wiring layer 113 may serve as a ground pattern, a power pattern, a signal pattern, and the like. Here, the signal pattern may include various signals except for the ground pattern, the power pattern, and the like, such as data signals, and the like. In addition, the first wiring layer 113 may serve as a via pad, a connection terminal pad, and the like. A thickness of the first wiring layer 113 is not particularly limited, but may be, for example, about 10 μm to 50 μm.

The second wiring layer 116 may basically disperse heat generated from the electronic component 120 so as to be diffused toward the frame 110, and block an electromagnetic wave. The second wiring layer 116 may also perform various functions depending on a design thereof, and may serve as a ground pattern. The second wiring layer 116 may be disposed on the inner wall 110X of the frame 110. Therefore, the second wiring layer 116 may surround the side surfaces of the electronic component 120. The second wiring layer 116 may be formed to completely cover the inner wall 110X of the frame 110. Copper (Cu), aluminum (Al), silver (Ag), tin (Sn), gold (Au), nickel (Ni), lead (Pd), titanium (Ti), or alloys thereof, may be used as a material of the second wiring layer 116.

The second wiring layer 116 may serve as a redistribution pattern, and a conductive material, such as copper (Cu), aluminum (Al), silver (Ag), tin (Sn), gold (Au), nickel (Ni), lead (Pd), titanium (Ti), or alloys thereof, may be used as a material of the second wiring layer 116. The second wiring layer 116 may also perform various functions depending on a design of the corresponding layer. For example, the second wiring layer 116 may serve as a ground pattern, a power pattern, a signal pattern, and the like. Similar to the first wiring layer 113, the signal pattern may include various signals except for the ground pattern, the power pattern, and the like, such as data signals, and the like. In addition, the second wiring layer 116 may serve as a via pad, a connection terminal pad, and the like. A thickness of the second wiring layer 116 is also not particularly limited, but may be, for example, about 10 μm to 50 μm.

The through-wirings 115 may penetrate through the frame 110, and serve to electrically connect redistribution layers disposed on different layers in relation to the frame 110 to each other. A conductive material, such as copper (Cu), aluminum (Al), silver (Ag), tin (Sn), gold (Au), nickel (Ni), lead (Pd), titanium (Ti), or alloys thereof, may be used as materials of the through-wirings 115. Upper and lower sides of the electronic component 120 may be electrically connected to each other through left and right side surfaces of the electronic component 120 via the through-wirings 115. Therefore, space utilization may be significantly increased. In addition, the electronic component package may be applied to a package-on-package (PoP), a system-in-package (SiP) or the like, through connection in a three-dimensional structure, such that the electronic component package may be applied to various modules, package applied product groups or the like.

The number, an interval, a disposition form, and the like, of through-wirings 115 are not particularly limited, but may be sufficiently modified, depending on design particulars by those skilled in the art. The through-wirings 115 may be connected to pad patterns of the first and third wiring layers 113 and 114. For example, the through-wirings 115 may be disposed in an entire region of the frame 110, depending on a form of another package mounted on the electronic component package 100. Alternatively, the through-wirings 115 may be disposed in only a specific region of the frame 110.

In a case in which a metal, such as an Fe—Ni based alloy or the like, is used as a material of the frame 110, an insulating material may be disposed between the metal and the through-wirings 115 in order to electrically insulate the metal and the through-wirings 115 from each other. A shape of a cross section of the through-wiring 115 is not particularly limited, but may be a known shape, such as a tapered shape, a sandglass shape, a pillar shape or the like. The through-wiring 115 may be completely filled with a conductive material, as illustrated in FIG. 3, but is not limited thereto. That is, a conductive material may be formed along a wall of a via.

In the present exemplary embodiment, the through-wirings 115 may be used as heat radiation paths, in addition to the function of the electric wirings described above. That is, the through-wirings 115 may be connected to the electronic component 120 by a wiring layer 152 including a metal component, to thereby become an effective heat radiation path, and may be thermally connected to the metal plate 140 disposed thereon to contribute to further improving heat radiation characteristics of the electronic component package 100.

The electronic component 120 may be an integrated circuit (IC) provided in an amount of several hundreds to several millions of elements or more integrated in a single chip, an active element or the like. The electronic component 120 may be an electronic component in which an integrated circuit is packaged in a flip-chip form, if necessary. The IC may be, for example, an application processor chip, such as a central processor (for example, a CPU), a graphic processor (for example, a GPU), a digital signal processor, a cryptographic processor, a microprocessor, a microcontroller or the like, but is not limited thereto.

The electronic component 120 may include electrode pads 120P formed for the purpose of electrical connection. The electronic pad 120P may be configured to electrically, externally connect the electronic component 120, and a material of the electrode pad 120P is not particularly limited as long as it is a conductive material. The conductive material may be copper (Cu), aluminum (Al), silver (Ag), tin (Sn), gold (Au), nickel (Ni), lead (Pd), titanium (Ti), or alloys thereof, but is not limited thereto. The electrode pad 120P may have an embedded form or a protruding form. A surface on which the electrode pads 120P are formed may be referred to as an active surface, and an opposite surface to the active surface may be referred to as an inactive surface.

In a case in which the electronic component 120 is an integrated circuit, the electronic component 120 may have a body (not denoted by a reference number), a passivation layer (not denoted by a reference number), and the electrode pads 120P. The body may be formed on the basis of, for example, an active wafer. In this case, silicon (Si), germanium (Ge), gallium arsenide (GaAs) or the like, may be used as a basic material of the body. The passivation layer may serve to protect the body from external factors, and may be formed of, for example, an oxide layer, a nitride layer or the like, or may be formed of a double layer, including an oxide layer and a nitride layer. The electrode pad 120P may include a conductive material, such as copper (Cu), aluminum (Al), silver (Ag), tin (Sn), gold (Au), nickel (Ni), lead (Pd), titanium (Ti), or alloys thereof, as described above.

A thickness of the electronic component 120 in a cross section thereof is not particularly limited, but may be changed depending on a kind of electronic component 120. For example, in the case in which the electronic component is an integrated circuit, a thickness of the electronic component may be about 100 µm to 480 µm, but is not limited thereto.

In the present exemplary embodiment, an encapsulant 130 may be used in order to protect the electronic component 120, and the like, as in the form illustrated in FIG. 3, even though it is not a necessary component. A form of the encapsulant 130 is not particularly limited, but may be a form surrounding at least portions of the electronic component 120. However, unlike the form illustrated in FIG. 3, the encapsulant 130 may cover the frame 110 and the electronic component 120, as an example, and may fill a space between the frame 110 and the electronic component 120 within the through-hole. Therefore, the encapsulant 130 may serve as an adhesive and may reduce buckling of the electronic component 120, depending on certain materials.

The certain materials of the encapsulant 130 are not particularly limited. For example, an insulating material may be used as a material of the encapsulant 130. In this case, the insulating material may be a thermosetting resin, such as an epoxy resin, a thermoplastic resin, such as a polyimide resin, a resin having a reinforcement material, such as an organic or inorganic filler impregnated in the thermosetting resin and the thermoplastic resin or the like. Alternatively, the insulating material may be an epoxy molding compound (EMC) or the like.

As described above, in the present exemplary embodiment, an effective heat radiation path is provided through the metal plate 140, and thus, an upper surface of the electronic component 120 is not covered by the encapsulant 130, but may be exposed. Therefore, heat may be smoothly radiated toward the metal plate 140 through an upper portion of the electronic component 120.

The redistribution layer 150 may be disposed at an opposite side to the metal plate 140 in relation to the electronic component 120, that is, beneath the electronic component 120 in FIG. 3, and may be electrically connected to the electronic component 120 and be configured to redistribute electrode pads 120P of the electronic component 120. Tens to hundreds of electrode pads 120P having various functions may be redistributed through the redistribution layer 150 and may be physically or electrically, externally connected through connection terminals 190, depending on functions thereof. The redistribution layer 150 may include insulating layers 151, wiring layers 152 formed on the insulating layers 151, and conductive vias 153 penetrating through the insulating layers 151. The redistribution layer 150 may be a single layer or be a plurality of layers.

Insulating materials may be used as materials of the insulating layers 151. Particularly, in a case in which photosensitive resins are used as materials of the insulating layers, the insulating layers 151 may be formed at a reduced thickness, and a fine pitch may be easily implemented. Materials of the insulating layers 151 may be the same as each other or may be different from each other, if necessary. Thicknesses of the insulating layers 151 are also not particularly limited. For example, thicknesses of the insulating layers 151, except for the wiring layers 152, may be about 5 µm to 20 µm, and thicknesses of the insulating layers 151, when considering thicknesses of the wiring layers 152, may be about 15 µm to 70 µm.

The wiring layers 152 may serve as redistribution patterns, and a conductive material, such as copper (Cu), aluminum (Al), silver (Ag), tin (Sn), gold (Au), nickel (Ni), lead (Pd), titanium (Ti), or alloys thereof, may be used as materials of the wiring layers 152.

A surface treatment layer may be further formed on a wiring layer externally exposed among the wiring layers 152, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL) or the like. This may also be applied to other wiring layers, and the like.

The conductive vias 153 may electrically connect the wiring layers 152, the electrode pads 120P, and the like, formed on different layers to each other, resulting in an electrical path in the electronic component package 100. Conductive materials, such as copper (Cu), aluminum (Al), silver (Ag), tin (Sn), gold (Au), nickel (Ni), lead (Pd), titanium (Ti), or alloys thereof, may be used as materials of the conductive vias 153. The conductive vias 153 may also be completely filled with a conductive material. Alternatively, a conductive material may be formed along walls of the conductive vias 153. In addition, the conductive vias 153 may be formed in all of the cross section shapes known in the related art, such as a tapered shape, a cylindrical shape or the like.

The metal plate 140 may serve as the heat radiation path of the heat generated in the electronic component 120 or the like, as described above, and may block an electromagnetic wave. To this end, a material having a high heat radiation property, such as copper (Cu), aluminum (Al), silver (Ag), tin (Sn), gold (Au), nickel (Ni), lead (Pd), titanium (Ti), or alloys thereof, may be used as a material of the metal plate 140.

A first adhesive layer 161 may be interposed between the metal plate 140 and the electronic component 120 in order to secure the metal plate 140 to the electronic component package 100. The first adhesive layer 161 may be formed of an insulating material having a high heat radiation property, such as conductive epoxy or the like. According to another embodiment, the electronic component package may be implemented in a form in which the electronic component 120 directly contacts the metal plate 140, as in a modified example of FIG. 4, without using the first adhesive layer 161. In this case, heat radiation characteristics may be further improved. In a case in which the first adhesive layer is not present between the electronic component 120 and the metal plate 140, as in the example of FIG. 4, the metal plate 140 may be coupled to the frame 110 by a second adhesive layer 162.

Again referring to FIG. 3, the second adhesive layer 162 may be interposed between the metal plate 140 and the frame 110 to couple the metal plate 140 and the frame 110 to each other. In this case, the second adhesive layer 162 may be formed of a material different from that of the first adhesive layer 161. For example, the second adhesive layer 162 may be formed of solder having excellent thermal conductivity. Through the form described above, the metal plate 140 may be connected to the through-wirings 115 of the frame 110 to serve as a heat radiation path for the heat radiated to a lower portion of the electronic component 120. The metal plate 140 may also be used without using the second adhesive layer 162, as in a form illustrated in FIG. 5, similar to the first adhesive layer 161. In this case, the metal plate 140 may directly contact the first wiring layer 113 of the frame 110 while being coupled to the electronic component 120 by the first adhesive layer 161.

The metal plate 140 may serve as a ground terminal for signal patterns, and the like, formed in the electronic component package, in addition to the heat radiation function described above. In this case, the metal plate 140 may be electrically connected to portions of the first wiring layer 113 and the second wiring layer 116 serving as ground terminals. In a case in which the metal plate 140 serves as the ground terminal, the metal plate 140 may be electrically connected to only some of the plurality of through-wirings 115, and may be electrically disconnected from the others, of the plurality of through-wirings 115. To this end, a portion of the second adhesive layer 162 used between the metal plate 140 and the frame 110 may be formed of a conductive material, such as solder, and the other regions of the second adhesive layer 162 may be formed of an insulating material, such as an insulating resin. Meanwhile, the metal plate 140 may also be provided only in order to improve heat radiation efficiency. In this case, the metal plate 140 may be electrically disconnected from the electronic component 120. To this end, the second adhesive layer 162 may be formed of an insulating material, or the through-wirings 115 or the like may be configured not to be electrically connected to the electronic component 120.

Other additional components will be described with reference to FIG. 3. A passivation layer 180 may be configured to protect the redistribution layer 150 from external physical or chemical damage or the like. The passivation layer 180 may have openings 181 exposing at least portions of the wiring layer 152 of the redistribution layer 150. Although the openings 181 expose portions of one surface of the wiring layer 152, the openings 181 may also expose side surfaces of the wiring layer 152, in some cases.

A material of the passivation layer 180 is not particularly limited. For example, a solder resist may be used as a material of the passivation layer 180. In addition, the same material as that of the insulating layer 151 of the redistribution layer 150, such as the photosensitive resin, may also be used as a material of the passivation layer 180. The passivation layer 180 is generally a single layer, but may also be multiple layers.

The connection terminals 190 may be configured to physically and electrically, externally connect the electronic component package 100. For example, the electronic component package 100 may be mounted on the main board of the electronic device through the connection terminals 190. The connection terminals 190 may be disposed on the openings 181, and may be connected to the wiring layer 152 exposed through the openings 181. Therefore, the connection terminals 190 may also be electrically connected to the electronic component 120.

The connection terminal 190 may be formed of a conductive material, such as copper (Cu), aluminum (Al), silver (Ag), tin (Sn), gold (Au), nickel (Ni), lead (Pd), solder or the like. However, these materials are only an example, and a material of the connection terminal 190 is not particularly limited thereto. The connection terminal 190 may be a land, a ball, a pin or the like. The connection terminal 190 may be formed of multiple layers or a single layer. In a case in which the connection terminal 190 is formed of the multiple layers, the connection terminal 190 may include a copper pillar and solder, and in a case in which the connection terminal 190 is formed of the single layer, the connection terminal 190 may include tin-silver solder or copper, but is not limited thereto.

At least one of the connection terminals 190 may be disposed in a fan-out region. The fan-out region is a region excluding a region in which the electronic component is disposed. That is, the electronic component package 100 according to an example may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package or the like, the fan-out package may be mounted on an electronic device without a separate board. Thus, the fan-out package may be manufactured to be thin, and may be price-competitive.

The number, an interval, a disposition form or the like, of the connection terminals 190 is not particularly limited, and may be sufficiently modified by a person skilled in the art, depending on design particulars. For example, the number of connection terminals 190 may be several tens to several thousands, depending on the number of electrode pads 120P of the electronic component 120. However, the number of connection terminals 190 is not limited thereto, and may also be several tens to several thousands or more or several tens to several thousands or less.

Figure 6:
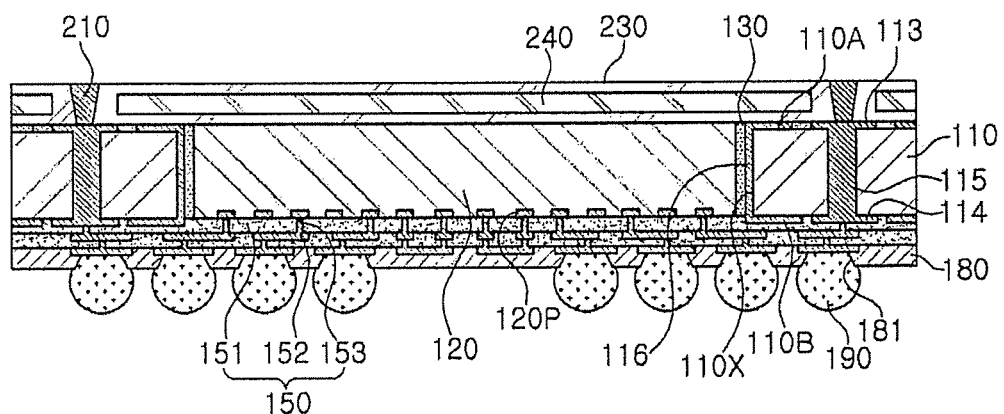
FIG. 6 is a schematic cross-sectional view illustrating another example of an electronic component package.

FIG. 6 is a schematic cross-sectional view illustrating another example of an electronic component package.

Referring to FIG. 6, an electronic component package 200 according to another example may include a frame 110, an electronic component 120, an encapsulant 130, a metal plate 240, a redistribution layer 150, and the like, similar to the exemplary embodiment described above. Hereinafter, components of the electronic component package 200 according to the present modified example will be described, and a description for contents overlapping the contents described above will be omitted, while mainly contents different from the contents described above will be described.

In the present modified example, an insulating layer 230 may be formed on the electronic component 120 and the metal plate 240. As in a form illustrated in FIG. 6, the insulating layer 230 may be formed on and beneath the metal plate 240. Therefore, the metal plate 240 may have a form in which it is embedded in the insulating layer 230. In this case, the insulating layer 230 may be formed of the known material having an electrical insulating property, such as the same material as that of the encapsulant 130. As a more detailed example, the insulating layer 230 may be implemented by stacking pre-preg (PPG) layers or the like, several times.

In the exemplary embodiment of FIG. 6, another package may be additionally disposed on the electronic component 120. Therefore, a POP structure may be implemented. To this end, the insulating layer 230 may include conductive vias 210. The conductive vias 210 may be connected to the through-wirings 115 of the frame 110, such that upper and lower electrical conduction structures may be obtained. In this case, as in the form illustrated in FIG. 6, the conductive vias 210 of the insulating layer 230 may penetrate through the metal plate 240, and may be electrically disconnected from the metal plate 240.

As set forth above, according to the exemplary embodiments in the present disclosure, a package technology capable of effectively radiating heat generated from the electronic component may be provided.

In the present disclosure, the terms "lower side", "lower portion", "lower surface", and the like, have been used to indicate a direction toward a mounted surface of the electronic component package in relation to cross sections of the drawings, the terms "upper side", "upper portion", "upper surface", and the like, have been used to indicate an opposite direction to the direction indicated by the terms "lower side", "lower portion", "lower surface", and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not always refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than to limit the present disclosure. In this case, singular forms include plural forms unless necessarily interpreted otherwise, based on a particular context.

While exemplary embodiments have been shown and described above, it will be apparent to those skilled in the art that modifications and variations could be made without departing from the scope of the present invention as defined by the appended claims.

What is claimed is:

1. An electronic component package, comprising:
    a frame having a through-hole;
    an electronic component disposed in the through-hole of the frame;
    an encapsulant disposed along an internal wall of the frame, and interposed between the frame and the electronic component, the encapsulant filling a first portion of the through-hole of the frame;
    a second metal layer disposed along the internal wall of the frame, and interposed between the frame and the encapsulant, the second metal layer filling a second portion of the through-hole of the frame;
    a third metal layer disposed directly on a lower surface of the frame;
    a metal plate disposed above the electronic component and the frame;
    an adhesive layer interposed between the metal plate and the electronic component, and between the metal plate and the frame; and
    a redistribution layer disposed below the electronic component and the frame, and electrically connected to the electronic component.

2. The electronic component package of claim 1, further comprising:
    a first metal layer disposed on an upper surface of the frame.

3. The electronic component package of claim 1, wherein the metal plate is electrically isolated from the electronic component.

4. The electronic component package of claim 1, further comprising:
    a through-wiring passing through the frame.

5. An electronic component package, comprising:
    a frame having a through-hole;
    an electronic component disposed in the through-hole of the frame;
    an encapsulant disposed along an internal wall of the frame, and interposed between the frame and the electronic component, the encapsulant filling a first portion of the through-hole of the frame;
a third metal layer disposed directly on a lower surface of the frame;
a metal plate disposed above the electronic component and the frame;
an adhesive layer interposed between the metal plate and the electronic component, and between the metal plate and the frame, the adhesive layer including a first adhesive layer including a conductive epoxy; and
a redistribution layer disposed below the electronic component and the frame, and electrically connected to the electronic component.

6. An electronic component package, comprising:
a frame having a through-hole;
an electronic component disposed in the through-hole of the frame;
an encapsulant disposed along an internal wall of the frame, and interposed between the frame and the electronic component, the encapsulant filling a first portion of the through-hole of the frame;
a third metal layer disposed directly on a lower surface of the frame;
a metal plate disposed above the electronic component and the frame;
an adhesive layer interposed between the metal plate and the electronic component, and between the metal plate and the frame, the adhesive layer including a second adhesive layer including a solder; and
a redistribution layer disposed below the electronic component and the frame, and electrically connected to the electronic component.

* * * * *